(12) United States Patent
Kusuda

(10) Patent No.: US 11,139,789 B1
(45) Date of Patent: Oct. 5, 2021

(54) CHOPPER AMPLIFIERS WITH TRACKING OF MULTIPLE INPUT OFFSETS

(71) Applicant: Analog Devices, Inc., Norwood, MA (US)

(72) Inventor: Yoshinori Kusuda, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/946,095

(22) Filed: Jun. 5, 2020

(51) Int. Cl.
| | |
|---|---|
| *H03F 3/45* | (2006.01) |
| *H03F 3/393* | (2006.01) |
| *H03F 1/26* | (2006.01) |
| *H03F 1/30* | (2006.01) |

(52) U.S. Cl.
CPC ........... *H03F 3/45475* (2013.01); *H03F 1/26* (2013.01); *H03F 1/304* (2013.01); *H03F 3/393* (2013.01); *H03F 3/45973* (2013.01); *H03F 3/45982* (2013.01); *H03F 2200/372* (2013.01); *H03F 2203/45138* (2013.01)

(58) Field of Classification Search
CPC ....................................................... H03F 3/45
USPC ..................................................... 330/9, 252
See application file for complete search history.

(56) References Cited

U.S. PATENT DOCUMENTS

| | | | |
|---|---|---|---|
| 6,734,723 B2 | 5/2004 | Huijsing et al. | |
| 7,209,000 B2 | 4/2007 | Huijsing et al. | |
| 7,295,061 B1 | 11/2007 | Dasgupta | |
| 7,764,118 B2 | 7/2010 | Kusuda et al. | |
| 7,973,596 B2 | 7/2011 | Eschauzier et al. | |
| 8,120,422 B1 | 2/2012 | Huijsing et al. | |
| 8,179,195 B1 | 5/2012 | Huijsing et al. | |
| 8,786,363 B2 | 7/2014 | Ahmad | |
| 8,829,988 B2 | 9/2014 | Motz et al. | |
| 9,294,049 B2 | 3/2016 | Huijsing et al. | |

(Continued)

FOREIGN PATENT DOCUMENTS

| | | |
|---|---|---|
| CN | 106972834 A | 7/2017 |
| CN | 108494370 A | 9/2018 |

(Continued)

OTHER PUBLICATIONS

Fan et al., "A 21 nV/ PHz Chopper-Stabilized Multi-Path Current-Feedback Instrumentation Amplifier with 2 μV Offset" IEEE Journal of Solid-State Circuits, vol. 47, No. 2, Feb. 2012 in 12 pages.

(Continued)

*Primary Examiner* — Henry Choe
(74) *Attorney, Agent, or Firm* — Knobbe, Martens, Olson & Bear, LLP

(57) ABSTRACT

Chopper amplifiers with tracking of multiple input offsets are disclosed herein. In certain embodiments, a chopper amplifier includes chopper amplifier circuitry including an input chopping circuit, an amplification circuit, and an output chopping circuit electrically connected along a signal path. The amplification circuit includes two or more pairs of input transistors, from which a control circuit chooses a selected pair of input transistors to amplify an input signal. The chopper amplifier further incudes an offset correction circuit that senses the signal path to generate an input offset compensation signal for the amplification circuit. Furthermore, the offset correction circuit separately tracks an input offset of each of the two or more pairs of input transistors.

20 Claims, 9 Drawing Sheets

(56) References Cited

U.S. PATENT DOCUMENTS

| | | |
|---|---|---|
| 9,564,859 B2 | 2/2017 | Ivanov et al. |
| 9,614,481 B2 | 4/2017 | Ivanov |
| 9,729,109 B2 | 8/2017 | Shu et al. |
| 10,003,306 B1 | 6/2018 | Larson et al. |
| 10,411,664 B2 | 9/2019 | Stanescu et al. |
| 2009/0115522 A1 | 5/2009 | Lyden et al. |
| 2009/0278597 A1* | 11/2009 | Zhang .................. H03F 3/005 330/9 |
| 2013/0335131 A1* | 12/2013 | Ceballos ............... G06G 7/18 327/337 |
| 2015/0207477 A1* | 7/2015 | Stanescu ............... H03F 3/387 330/9 |
| 2016/0006403 A1 | 1/2016 | Ivanov et al. |
| 2016/0056707 A1 | 2/2016 | Wong et al. |
| 2018/0198417 A1 | 7/2018 | Vijaykumar et al. |
| 2019/0079143 A1 | 3/2019 | Romero et al. |
| 2019/0158034 A1 | 5/2019 | Sloboda et al. |

FOREIGN PATENT DOCUMENTS

| | | |
|---|---|---|
| EP | 2327153 B1 | 4/2017 |
| WO | WO2019170237 A1 | 9/2019 |

OTHER PUBLICATIONS

Kusuda, Delft University of Technology, "Reducing Switching Artifacts in Chopper Amplifiers" 2018 in 209 pages.

Kusuda, IEICE Transactions on Electronics, "Techniques of Reducing Switching Artifacts in Chopper Amplifiers" dated Apr. 9, 2020 in 9 pages.

Moghimi, Analog Devices, Inc. To Chop or Auto-Zero: That Is the Question (Technical Article MS-2062) dated Jun. 2011 in 6 pages.

Wu, et al., "A Chopper Current-Feedback Instrumentation Amplifier with a 1 mHz 1/f Noise Corner and an AC-Coupled Ripple Reduction Loop", IEEE J. Solid-State Circuits, vol. 44, No. 12, pp. 3232-3243, Dec. 2009 in 12 pages.

\* cited by examiner

CHOPPER AMPLIFIERS WITH TRACKING OF MULTIPLE INPUT OFFSETS

FIELD OF THE DISCLOSURE

Embodiments of the invention relate to electronic systems, and more particularly, to amplifiers.

BACKGROUND

An amplifier, such as an operational or instrumentation amplifier, can include chopper circuitry to help compensate for the amplifier's input offset voltage. For example, a chopper amplifier can include an input chopping circuit that can be used to chop the amplifier's input signal during an input chopping operation, thereby up-shifting the frequency of the amplifier's input signal. The chopper amplifier can further include an amplification circuit for amplifying the chopped input signal, and an output chopping circuit for down-shifting the frequency of the amplified signal during an output chopping operation. By providing chopping in this manner, the amplifier's input offset voltage is separated in frequency from the chopped input signal, and thus can be filtered or otherwise attenuated.

SUMMARY OF THE DISCLOSURE

Chopper amplifiers with tracking of multiple input offsets are disclosed herein. In certain embodiments, a chopper amplifier includes chopper amplifier circuitry including an input chopping circuit, an amplification circuit, and an output chopping circuit electrically connected along a signal path. The amplification circuit includes two or more pairs of input transistors, from which a control circuit chooses a selected pair of input transistors to amplify an input signal. The chopper amplifier further incudes an offset correction circuit that senses the signal path to generate an input offset compensation signal for the amplification circuit. Furthermore, the offset correction circuit separately tracks an input offset of each of the two or more pairs of input transistors. Accordingly, the selected pair of input transistors can be changed with little to no delay in the offset correction circuit compensating for input offset and suppressing chopping ripple. In particular, because the offset correction circuit separately tracks the input offset of each pair of input transistors, the input offset compensation signal can be quickly updated to a suitable signal value for compensation in response to a change in the selected pair of input transistors.

In one aspect, chopper amplifier with tracking of multiple input offsets is provided. The chopper amplifier includes chopper amplifier circuitry including an input chopping circuit configured to chop an input signal to generate a chopped input signal, an amplification circuit configured to amplify the chopped input signal to generate an amplified signal, wherein the amplification circuit includes two or more pairs of input transistors that are selectable, an output chopping circuit configured to chop the amplified signal to generate a chopped output signal, and a control circuit configured to choose a selected pair of input transistors from the two or more pairs of input transistors, wherein the selected pair of input transistors is configured to amplify the chopped input signal. The chopper amplifier further includes an offset correction circuit configured to generate an input offset compensation signal for the chopper amplifier circuitry, wherein the offset correction circuit separately tracks an input offset of each of the two or more pairs of input transistors.

In another aspect, a method of amplification is provided. The method includes chopping an input signal to generate a chopped input signal using an input chopping circuit, selecting a pair of input transistors from two or more pairs of input transistors of an amplification circuit using a control circuit, amplifying the chopped input signal to generate an amplified signal using the selected pair of input transistors, chopping the amplified signal to generate a chopped output signal using an output chopping circuit, and compensating the amplification circuit using an input offset compensation signal generated by an offset correction circuit, including separately tracking an input offset of each of the two or more pairs of input transistors.

In another aspect, a chopper amplifier includes a pair of input terminals, and chopper amplifier circuitry including an input chopping circuit including an input coupled to the pair of input terminals, an amplification circuit including an input coupled to an output of the input chopping circuit, wherein the amplification circuit includes two or more pairs of input transistors that are selectable, an output chopping circuit including an input coupled to an output of the amplification circuit; and a control circuit configured to choose a selected pair of input transistors from the two or more pairs of input transistors to provide amplification. The chopper amplifier further includes an offset correction circuit configured to separately track an input offset of each of the two or more pairs of input transistors, and to generate an input offset compensation signal for compensating the amplification circuit.

DETAILED DESCRIPTION OF EMBODIMENTS

Figure 1:
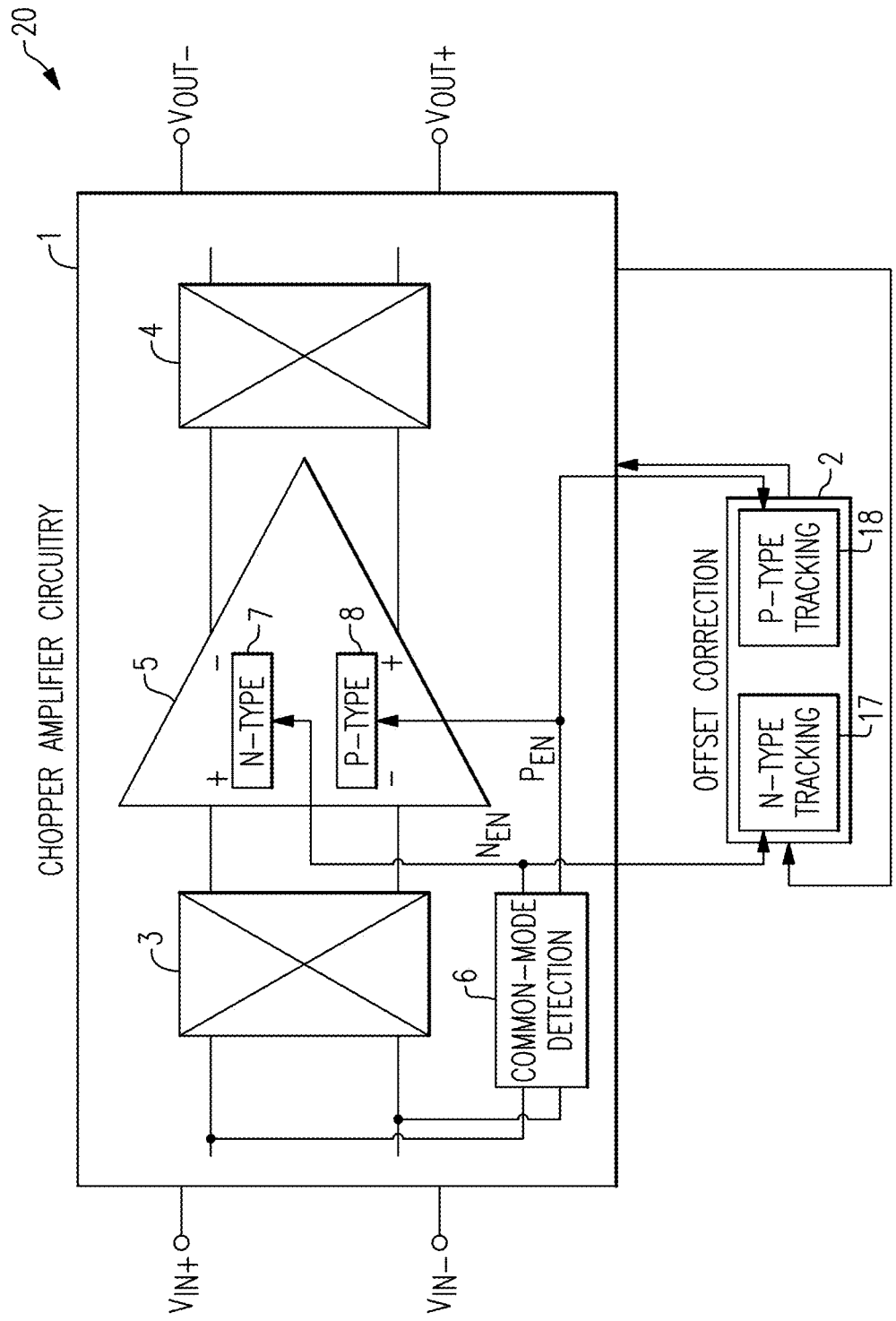
FIG. 1 is a schematic diagram of a chopper amplifier according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Absent compensation, an amplifier can have an input offset voltage and/or low frequency noise, such as flicker or 1/f noise having an associated noise power spectral density (PSD) that becomes larger at lower frequencies.

To reduce or remove input offset voltage and/or low frequency noise, an amplifier can include chopper circuitry. An amplifier with chopper circuitry is referred to as a chopper amplifier. In one example, a chopper amplifier includes an input chopping circuit that chops or modulates the amplifier's input signal during an input chopping operation, thereby up-shifting the frequency of the amplifier's input signal. Furthermore, the chopper amplifier includes an amplification circuit that amplifies the chopped input signal, and an output chopping circuit that chops or demodulates the amplified signal during an output chopping operation. By providing chopping in this manner, the amplifier's input offset voltage and/or low frequency noise is separated in frequency from the desired signal, and thus can be filtered or otherwise attenuated.

In certain implementations, a chopper amplifier can further include autozero circuitry. Including both autozero and chopper circuitry in a chopper amplifier can further lower overall input offset voltage and/or low frequency noise. The teachings herein are applicable not only to chopper amplifiers that provide chopping, but also to chopper amplifiers that combine chopping with autozeroing and/or other compensation schemes.

An amplifier's chopping operations can result in ripple appearing in the amplifier's output voltage. The chopping ripple can have a magnitude that changes in relation to the magnitude of the amplifier's input offset voltage and/or low frequency noise. Thus, chopping may result in the amplifier's input offset voltage and/or low frequency noise not being cancelled, but instead being modulated up by the chopping frequency to generate chopping ripple that corrupts the spectral integrity of the amplifier's output signal.

Although a low-pass post filter can be included after the output chopping circuit to filter chopping ripple associated with modulated input offset voltage and/or modulated low frequency noise, it can be desirable to reduce the amplifier's input offset voltage and/or low frequency noise to avoid a need for a post filter or to relax a design constraint of the post filter. In another example, a switched capacitor notch filter can be included after the output chopping circuit to provide attenuation of chopping ripple.

To provide input offset compensation and suppress chopping ripple, feedback and/or feedforward correction paths can be used. For example, such correction path(s) can be used to generate an input offset correction signal to compensate for input offset prior to output chopping, thereby suppressing chopping ripple.

In certain applications, a chopper amplifier includes multiple pairs of input transistors, each of which can be selected for amplifying the input signal based on operating conditions and/or parameters. For example, certain chopper amplifiers operate over a wide range of input common-mode voltage, and thus include multiple pairs of input transistors for amplifying the input signal based on a detected input common-mode voltage. In particular, the chopper amplifier can include a pair of n-type input transistors for amplifying the input signal over an upper portion of the input common-mode voltage range, and a pair of p-type input transistors for amplifying the input signal over a lower portion of the input common-mode voltage range. In contrast, a chopper amplifier with only a single pair of input transistors may have insufficient voltage headroom to operate over a wide input common-mode voltage range, for instance, rail-to-rail operation.

When transitioning from using one pair of input transistors to another pair of input transistors, the chopper amplifier's offset correction circuitry can have a delay in properly compensating for the input offset of the newly selected pair of input transistors. For example, each input transistor pair of the chopper amplifier can have a different input offset voltage, and thus when the selected pair of input transistors changes, an input offset correction signal generated by the offset correction circuitry can have a delay in settling to a steady-state value suitable for properly compensating the newly selected pair.

Chopper amplifiers with tracking of multiple input offsets are disclosed herein. In certain embodiments, a chopper amplifier includes chopper amplifier circuitry including an input chopping circuit, an amplification circuit, and an output chopping circuit electrically connected along a signal path. The amplification circuit includes two or more pairs of input transistors, from which a control circuit chooses a selected pair of input transistors to amplify an input signal. The chopper amplifier further incudes an offset correction circuit that senses the signal path to generate an input offset compensation signal for the amplification circuit. Furthermore, the offset correction circuit separately tracks an input offset of each of the two or more pairs of input transistors.

Accordingly, the selected pair of input transistors can be changed with little to no delay in the offset correction circuit compensating for input offset and suppressing chopping ripple. In particular, because the offset correction circuit separately tracks the input offset of each pair of input transistors, the input offset compensation signal can be quickly updated to a suitable signal value for compensation in response to a change in the selected pair of input transistors.

In certain implementations, the two or more pairs of input transistors includes a pair of p-type input transistors and a pair of n-type input transistors, and the control circuit determines whether to use the pair of p-type input transistors or the pair of n-type input transistors based on sensing an input common-mode voltage of the chopper amplifier. For example, the control circuit can use the pair of n-type input transistors over a first range of input common-mode voltage, and use the pair of p-type input transistors over a second range of input common-mode voltage. As the input common-mode voltage changes, the selection of the pair of n-type input transistors or the pair of p-type input transistors can also change. Furthermore, since the input offset of the n-type input transistors and the input offset of the p-type input transistors are separately tracked, the input offset compensation signal can be quickly updated to a proper signal level when the selected pair of input transistors changes. Thus, seamless or near seamless switching between the n-type input transistors and the p-type input transistors is achieved.

The pairs of input transistors can correspond to a wide variety of transistor types including, but not limited to, field-effect transistors (FETs), such as metal-oxide-semiconductor (MOS) transistors. MOS transistors can be associated with a wide variety of manufacturing processes including not only bulk complementary MOS (CMOS) processes, but also triple well CMOS processes, silicon on insulator (SOI) processes, double-diffused MOS (DMOS) processes, as well as a wide range of other manufacturing processes. In certain implementations, the two or more pairs of input transistors include a pair of n-type MOS (NMOS) transistors, such as n-type DMOS transistors, and a pair of p-type MOS (PMOS) transistors, such as p-type DMOS transistors.

The offset correction circuit can be implemented in a wide variety of ways. In certain implementations, the offset correction circuit includes digital circuitry used to separately track the input offset of two or more pairs of input transistors. Using digital circuitry can provide a number of advantages.

In a first example, the digital circuitry can include a non-volatile memory for storing digital data representing the input offset voltages of each pair of input transistors of the amplification circuit. Thus, after a power cycle of the chopper amplifier in which the chopper amplifier is powered down and then powered back up, the chopper amplifier can quickly resume precision amplification using any selected pair of input transistors. In contrast, a chopper amplifier without such a feature can have a long delay at start-up in settling to a steady-state signal value suitable for input offset compensation.

In a second example, the digital circuitry is coupled to a digital interface (for instance, a serial interface or parallel interface of a semiconductor die or chip), which allows the digital data to be observed off-chip and/or for digital data to be loaded into the chopper amplifier after power-up to achieve input offset compensation with little to no delay.

In a third example, the digital circuitry can hold input offset correction data for an indefinite amount of time without having a chopping clock signal toggle. Thus, the user can stop and resume the chopping clock signal at any time and after any duration. Furthermore, a particular pair of input transistors can remain unused for a long period of time without impacting the ability of the digital circuitry to store input offset correction data for that pair. In contrast, analog circuitry can be subject to leakage currents and/or noise that necessitates the analog circuitry to be regularly operated with the chopping clock signal to maintain proper input offset compensation.

The offset correction circuits herein can be used not only to compensate for input offset voltage of two or more pairs of input transistors of an amplification circuit, but also to reduce or eliminate other low frequency input noise sources, such as flicker noise. This in turn leads to reduced output chopping ripple, lower flicker noise current, and/or enhanced spectral output purity of the chopper amplifier.

FIG. 1 is a schematic diagram of a chopper amplifier 20 according to one embodiment. The chopper amplifier 20 includes chopper amplifier circuitry 1 and an offset correction circuit 2 for compensating for an input offset voltage of the chopper amplifier circuitry 1 while suppressing output chopping ripple.

As shown in FIG. 1, the chopper amplifier 20 receives a differential input signal between a positive or non-inverted input voltage terminal $V_{IN+}$ and a negative or inverted input voltage terminal $V_{IN-}$, which operate as a pair of differential input terminals $V_{IN+}$, $V_{IN-}$. The chopper amplifier 20 also outputs a differential output signal between a positive or non-inverted output voltage terminal $V_{IN+}$ and a negative or inverted output voltage terminal $V_{IN-}$, which operate as a pair of differential output terminals $V_{OUT+}$, $V_{OUT-}$.

Although FIG. 1 illustrates a configuration in which the chopper amplifier 20 generates a differential output signal, the chopper amplifier 20 can be adapted to generate other output signals, including, for example, a single-ended output signal. Additionally, although FIG. 1 illustrates the chopper amplifier 20 in an open-loop configuration, the chopper amplifier 20 can be used in closed-loop configurations.

In the illustrated embodiment, the chopper amplifier circuitry 1 includes an input chopping circuit 3, an amplification circuit 5, and an output chopping circuit 4, which are electrically connected in a cascade along a signal path, with the amplification circuit 5 between the input chopping circuit 3 and the output chopping circuit 4. The chopper amplifier circuitry 1 further includes a control circuit, corresponding to a common-mode detection circuit 6, in this embodiment.

Although certain components of the chopper amplifier circuitry 1 are shown, the chopper amplifier circuitry 1 can include additional components or circuits, including, but not limited to, one or more additional amplification stages, output stages, feedforward paths, and/or feedback paths. Accordingly, other implementations are possible.

The input chopping circuit 3 operates to chop or modulate the differential input signal to generate a chopped differential input signal, which is amplified by the amplification circuit 5 to generate an amplified differential signal. The chopping operation of the input chopping circuit 3 upshifts the frequency of the differential input signal. For example, in certain implementations the chopping clock signal of the input chopping circuit 3 is a square wave, which can be equivalently represented by a Fourier series of sine waves at the chopping frequency and at odd harmonics thereof. By modulating the differential input signal by such a square wave, the frequency content of the differential input signal is upshifted. Accordingly, the chopped differential input signal includes signal content at the chopping frequency and odd harmonics thereof. Thus, the chopped differential input signal is separated in frequency from input offset voltage and/or low frequency noise of the amplification circuit 5.

As shown in FIG. 1, the amplification circuit 5 includes multiple pairs of input transistors, corresponding to a pair of n-type input transistors 7 and a pair of p-type input transistors 8, in this embodiment. Each of the pairs of input transistors are individually selectable by the chopper amplifier circuitry's control circuit, and can have different input offsets.

In certain implementations, the input chopping circuit 3 includes separate sets of input chopping switches for each pair of input transistors of the amplification circuit 5. In other implementations, a shared set of chopping switches is used for the pairs of input transistors.

In the illustrated embodiment, the common-mode detection circuit 6 generate a first enable signal $N_{EN}$ for selecting the pair of n-type input transistors 7 for amplification, and a second enable signal $P_{EN}$ for selecting the pair of p-type input transistors 8 for amplification. The common-mode detection circuit 6 chooses the selected pair of input transistors based on a sensed input common-mode voltage, in this embodiment. For example, due to limitations arising from supply voltage headroom, the pair of n-type input transistors 7 is well-suited for providing amplification at high input common-mode voltage (for instance, near $V_{DD}$), while the pair of p-type input transistors 8 is well-suited for providing amplification at low input common-mode voltage (for instance, near $V_{SS}$).

Accordingly, in certain implementations, the common-mode detection circuit 6 activates the pair of n-type input transistors 7 and deactivates the pair of p-type input transistors 8 when the detected input common-mode voltage is high, and activates the pair of p-type input transistors 8 and deactivates the pair of n-type input transistors 7 when the detected input common-mode voltage is low. For a middle band of input common-mode voltage, the common-mode detection circuit 6 can activate either the n-type input transistors 7 or the p-type input transistors 8, based on implementation.

The selected pair of input transistors amplifies the chopped differential input signal to generate the amplified differential signal. The amplified differential signal is chopped by the output chopping circuit 4, thereby down-shifting signal frequency content. The chopped differential output signal can be outputted with or without further processing (for instance, amplification, filtering and/or integration) to generate the differential output signal of the chopper amplifier 20.

The chopper amplifier 20 further includes the offset correction circuit 2, which senses the signal path through the chopper amplifier circuitry 1 at one or more points or positions. Additionally, the offset correction circuit 2 injects an input offset voltage compensation signal into the signal path of the chopper amplifier circuitry 1 to compensate for input offset voltage and to suppress chopping ripple.

In the illustrated embodiment, the offset correction circuit 2 separately tracks the input offset of each pair of input transistors of the amplification circuit 5. In particular, the offset correction circuit 2 includes a first tracking circuit 17 for tracking the input offset of the pair of n-type input transistors 7, and a second tracking circuit 18 for tracking the input offset of the pair of p-type input transistors 8. Although depicted as separate components, the first tracking circuit 17 and the second tracking circuit 18 can share certain circuitry, for instance, a portion of the offset correction circuit 2 used for sensing, amplifying, chopping, and/or other processing.

As shown in FIG. 1, the offset correction circuit 2 receives the first enable signal $N_{EN}$ and the second enable signal $P_{EN}$ from the common-mode detection circuit 6. The first enable signal $N_{EN}$ and the second enable signal $P_{EN}$ can be used to activate tracking operations of the first tracking circuit 17 and the second tracking circuit 18, respectively. Accordingly, suitable input offset correction and chopping ripple suppression is provided for the selected pair of input transistors of the amplification circuit 5.

In certain implementations, the input offset compensation signal is injected into a portion of the signal path of the chopper amplifier circuitry 1 between the amplification circuit 5 and the output chopping circuit 4. By compensating for such low frequency noise prior to output chopping, generation of chopping voltage ripple in the differential output signal is reduced or eliminated.

Figure 2A:
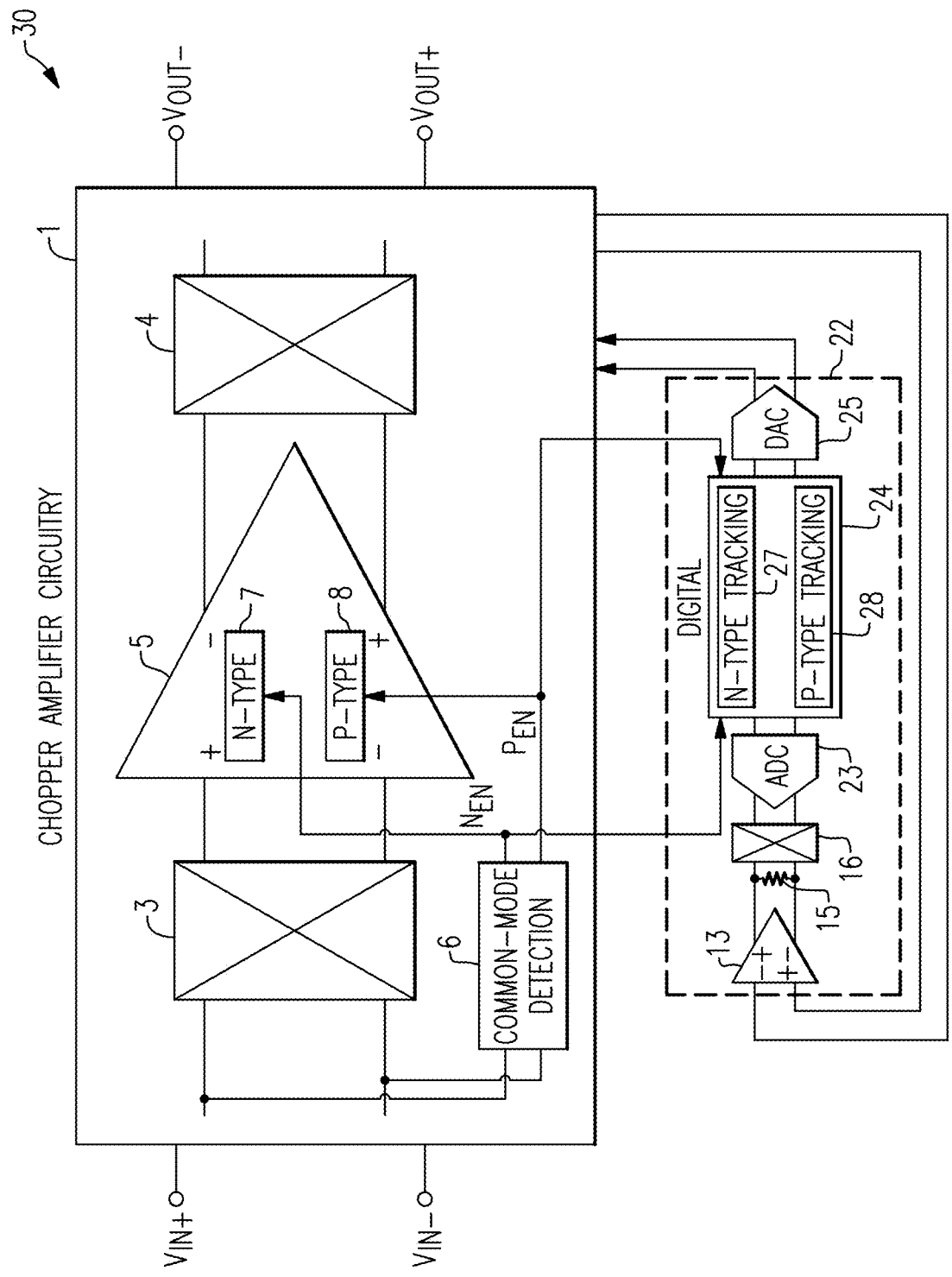
FIG. 2A is a schematic diagram of a chopper amplifier according to another embodiment.

FIG. 2A is a schematic diagram of a chopper amplifier 30 according to another embodiment. The chopper amplifier 30 includes chopper amplifier circuitry 1 and an offset correction circuit 22.

The chopper amplifier 30 of FIG. 2A is similar to the chopper amplifier 20 of FIG. 1, except that the chopper amplifier 30 of FIG. 2A includes a different implementation of an offset correction circuit. In particular, the offset correction circuit 22 of FIG. 2A includes a sense amplifier 13, a resistor 15, a chopping circuit 16, an analog-to-digital converter (ADC) 23, a digital circuit 24, and a digital-to-analog converter (DAC) 25. Additionally, the digital circuit 24 includes an n-type tracking circuit 27 and a p-type tracking circuit 28.

In the illustrated embodiment, the sense amplifier 13 includes a differential input coupled to a sensing point along the signal path of the chopper amplifier circuitry 1. In certain implementations, the sensing point is along the signal path after the output chopping circuit 4. However, the teachings herein are applicable to offset correction circuits that sense input offset in a wide variety of ways.

As shown in FIG. 2A, an output signal from the sense amplifier 13 is provided to the chopping circuit 16. In certain implementations, the output signal from the sense amplifier 13 is a current that flows through the resistor 15 to generate an input voltage signal for the chopping circuit 16. The chopping circuit 16 generates an output signal, which is digitized by the ADC 23 and processed by the digital circuit 24 to generate digital correction data.

The digital correction data is used by the DAC 25 to generate a differential input offset compensation signal provided to the chopper amplifier circuitry 1. In certain implementations, the differential input offset compensation signal is provided to a differential output of the amplification circuit 5 to compensate for the input offset voltage of the selected pair of input transistors of the amplification circuit 5.

With continuing reference to FIG. 2A, the offset correction circuit 22 receives the first enable signal $N_{EN}$ and the second enable signal $P_{EN}$ from the common-mode detection circuit 6. The first enable signal $N_{EN}$ and the second enable signal $P_{EN}$ are used to activate tracking operations of the first tracking circuit 27 and the second tracking circuit 28, respectively.

Accordingly, when the common-mode detection circuit 6 changes the selected pair of input transistors from the p-type pair 8 to the n-type pair 7, or vice versa, the corresponding digital tracking circuit of the offset correction circuit 22 is activated. Accordingly, the digital correction data provided to the DAC 25 is updated, such that the differential input offset compensation signal provided to the chopper amplifier circuitry 1 is at a suitable signal level for compensating for the input offset of the selected pair of input transistors. Thus, the selected pair of input transistors can be switched with little to no delay and without impacting an ability of the chopper amplifier 30 to provide precision amplification with low input offset.

Figure 2B:
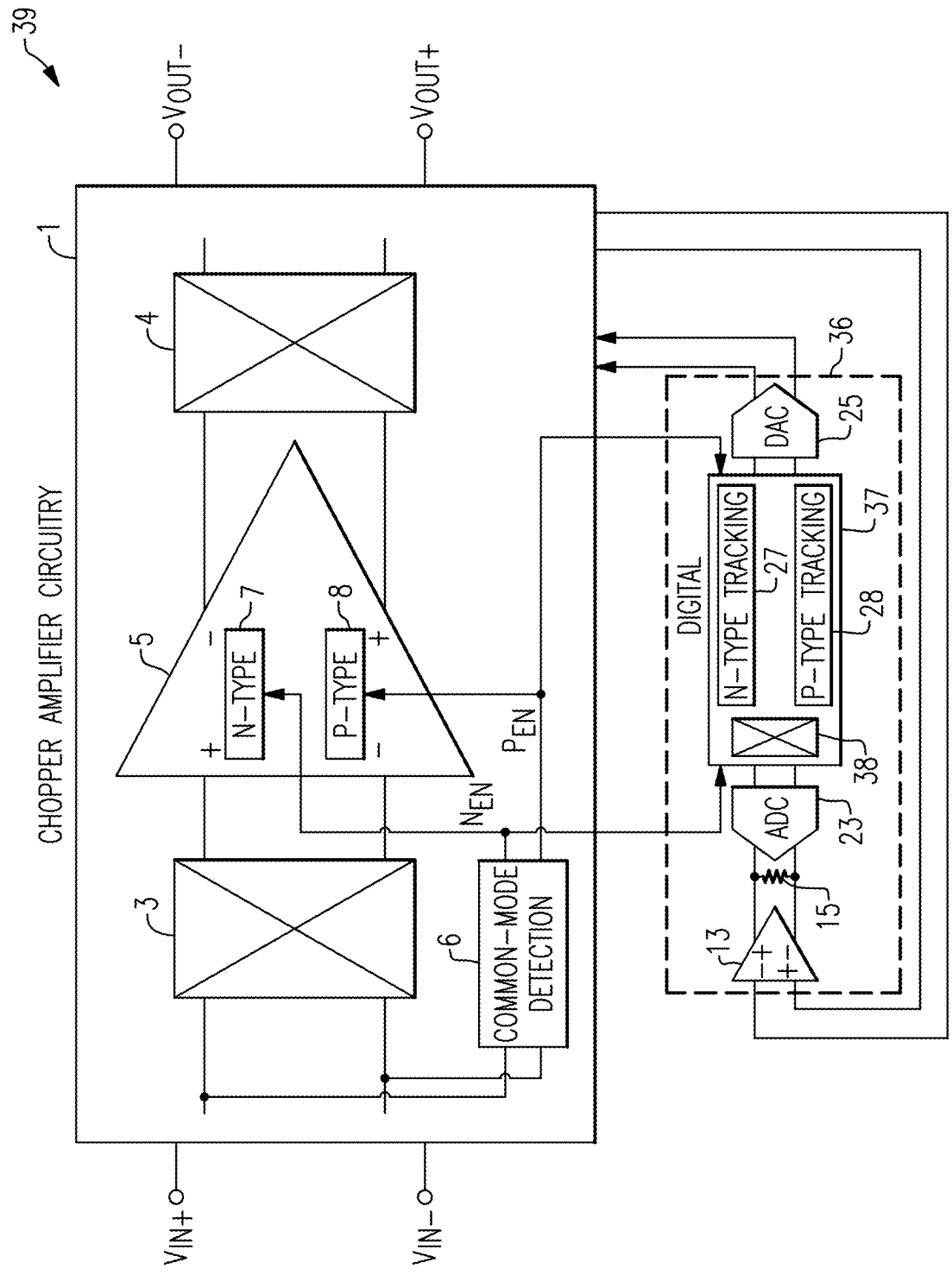
FIG. 2B is a schematic diagram of a chopper amplifier according to another embodiment.

FIG. 2B is a schematic diagram of a chopper amplifier 39 according to another embodiment. The chopper amplifier 39 includes chopper amplifier circuitry 1 and an offset correction circuit 36.

The chopper amplifier 39 of FIG. 2B is similar to the chopper amplifier 30 of FIG. 2A, except that the offset correction circuit 36 of FIG. 2B omits the chopping circuit 16 shown in FIG. 2A. Additionally, the offset correction circuit 36 includes a digital circuit 37 that provides digital chopping 38. Any of the offset correction circuits herein can be adapted to operate with digital chopping.

Figure 3:
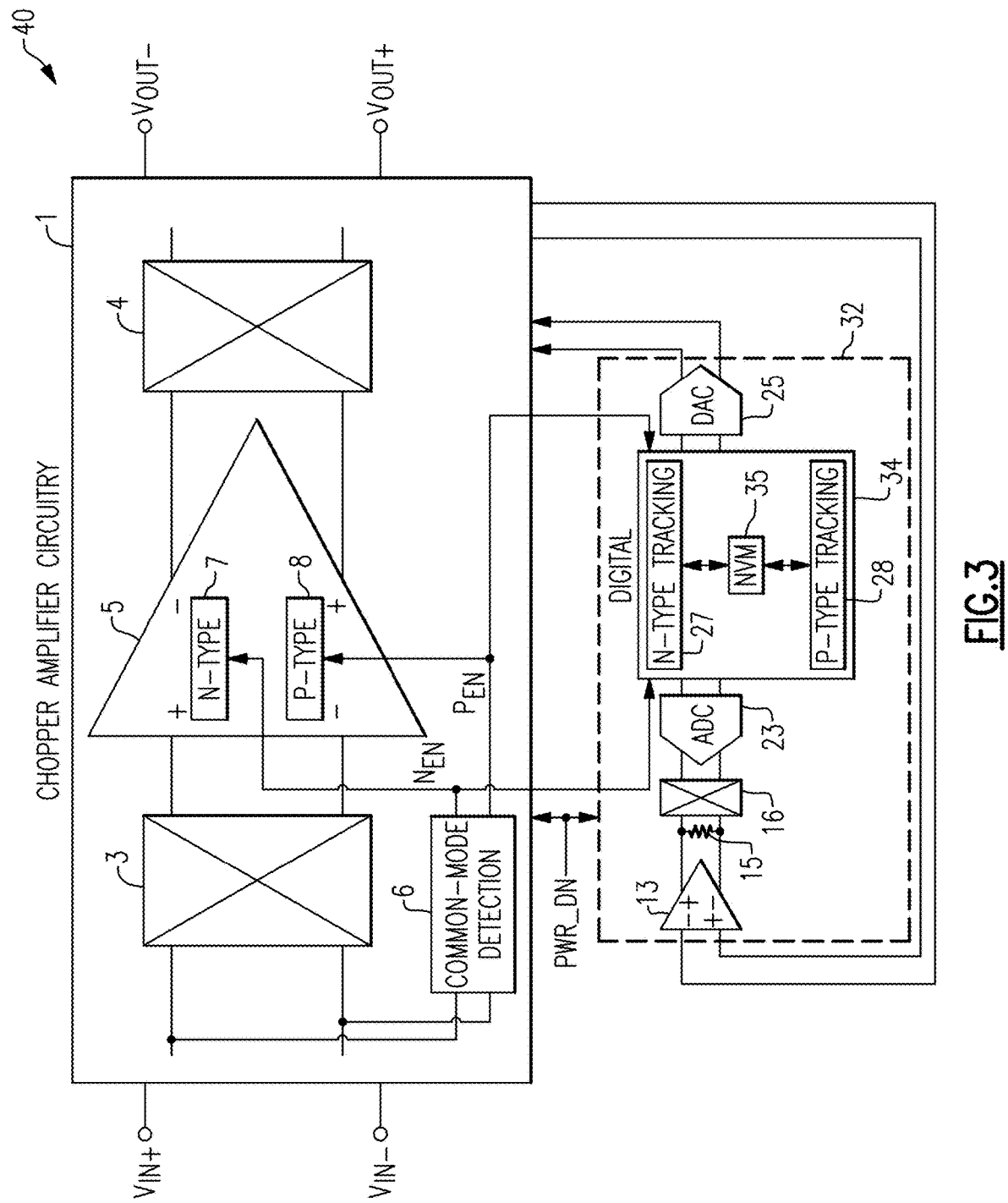
FIG. 3 is a schematic diagram of a chopper amplifier according to another embodiment.

FIG. 3 is a schematic diagram of a chopper amplifier 40 according to another embodiment. The chopper amplifier 40 includes chopper amplifier circuitry 1 and an offset correction circuit 32.

The chopper amplifier 40 of FIG. 3 is similar to the chopper amplifier 30 of FIG. 2A, except that the offset correction circuit 32 of FIG. 3 includes a digital circuit 34 that includes a non-volatile memory (NVM) 35. The NVM 35 is used to store digital data indicating signal values of the differential input offset compensation signal when tracking the pair of n-type input transistors 7 and when tracking the pair of p-type input transistors 8.

By including the NVM 35, the chopper amplifier 40 can quickly resume amplification after a power cycle. Such a power cycle can correspond to a ramp down and ramp up of the chopper amplifier's supply voltage, and/or a power down signal (PWR_DN) can be used to turn on and off the chopper amplifier 40. By including the NVM 35, data indicating the signal values for input offset compensation of each transistor pair is not lost during the power cycle. Thus, a start-up delay in settling to a steady-state signal value for input offset compensation is avoided. Furthermore, either the pair of n-type input transistors 7 or the pair of p-type input transistors 8 can be used after the power cycle.

Figure 4:
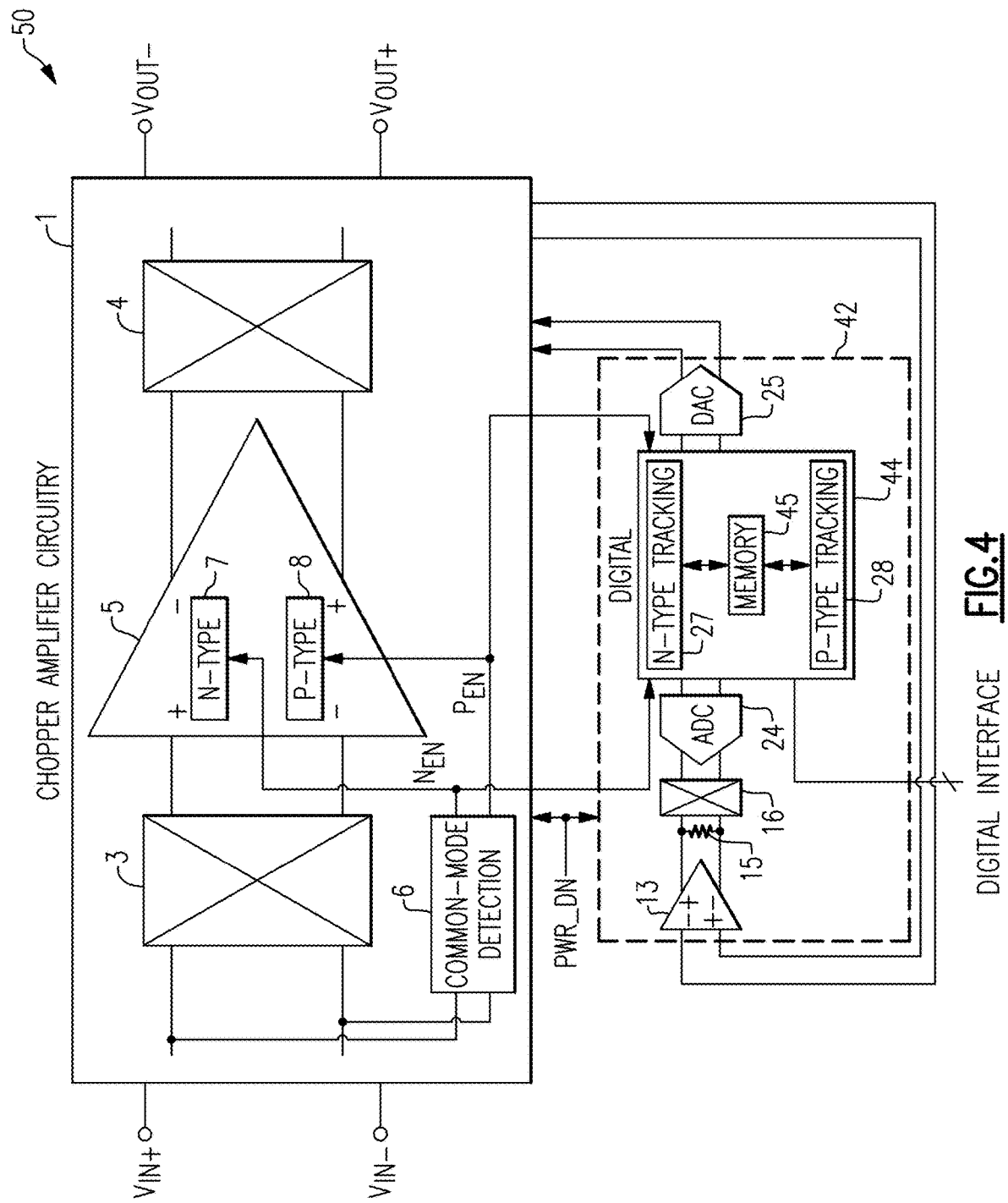
FIG. 4 is a schematic diagram of a chopper amplifier according to another embodiment.

FIG. 4 is a schematic diagram of a chopper amplifier 50 according to another embodiment. The chopper amplifier 50 includes chopper amplifier circuitry 1 and an offset correction circuit 42.

The chopper amplifier 50 of FIG. 4 is similar to the chopper amplifier 30 of FIG. 2A, except that the offset correction circuit 42 of FIG. 4 includes a digital circuit 44 coupled to a digital interface and that includes a memory 45, which can be volatile or non volatile. The memory 45 is used to store digital data indicating signal values of the differential input offset compensation signal for tracking the n-type pair 7 and the p-type pair 8. The memory 45 can be read from or written to using the digital interface, which can correspond to a serial interface or parallel interface of a semiconductor chip on which the chopper amplifier 50 is fabricated.

Implementing the digital circuit 44 to communicate over the digital interface allows the digital data to be observed off-chip and/or for digital data to be loaded into the chopper amplifier 50 after power-up or a power cycle to achieve input offset compensation with little to no delay.

Figure 5:
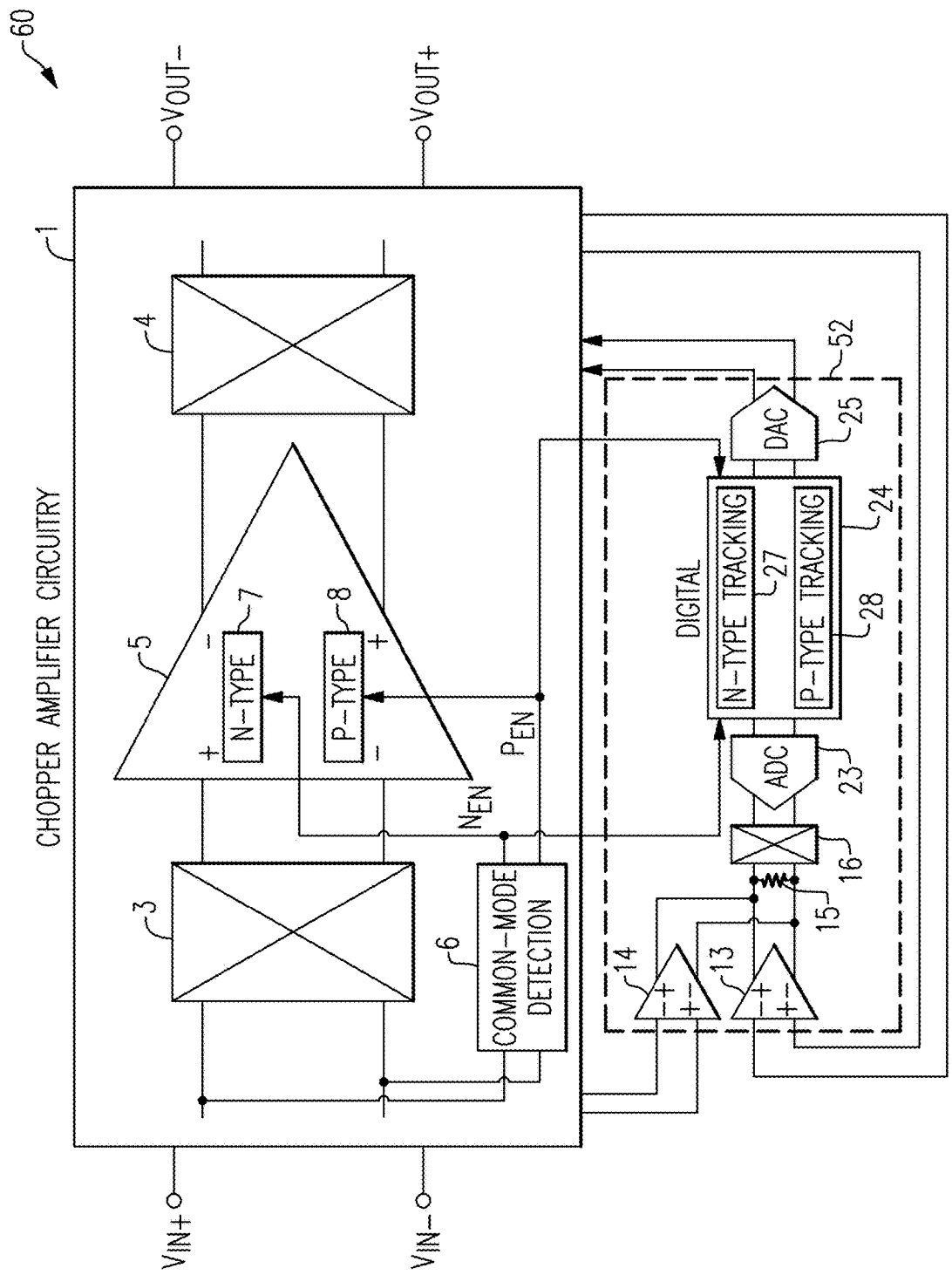
FIG. 5 is a schematic diagram of a chopper amplifier according to another embodiment.

FIG. 5 is a schematic diagram of a chopper amplifier 60 according to another embodiment. The chopper amplifier 60 includes chopper amplifier circuitry 1 and an offset correction circuit 52.

The chopper amplifier 60 of FIG. 5 is similar to the chopper amplifier 30 of FIG. 2A, except that the offset correction circuit 52 of FIG. 5 further includes a second sense amplifier 14. Thus, the offset correction circuit 52 senses the signal path of the chopper amplifier circuitry 1 at multiple points or positions.

In the illustrated embodiment, the first sense amplifier 13 includes a differential input coupled to a first sensing point along the signal path of the chopper amplifier circuitry 1, while the second sense amplifier 14 includes a differential input coupled to a second sensing point along the signal path of the chopper amplifier circuitry 1. In certain implementations, the first sensing point is before the input chopping circuit 3, while the second sensing point is after the output chopping circuit 4.

The first sense amplifier 13 and the second sense amplifier 14 can each include one or more stages. In certain implementations, an input stage of the first sense amplifier 13 includes a replica of the n-type pair 7 and a replica of the p-type pair 8, with or without scaling.

As shown in FIG. 5, an output signal from the first sense amplifier 13 and an output signal from the second sense amplifier 14 are combined, and thereafter chopped using the chopping circuit 16 to generate a combined sense signal that is inputted to the ADC 23. In certain implementations, the output signal from the first sense amplifier 13 and the output signal from the second sense amplifier 14 correspond to currents that flow through the resistor 15 to generate an input voltage signal for the chopping circuit 16.

The input offset correction circuits herein can be implementing using a wide variety of sensing configurations, including configurations using one or more feedback paths, one or more feedforward paths, or a combination thereof.

Figure 6:
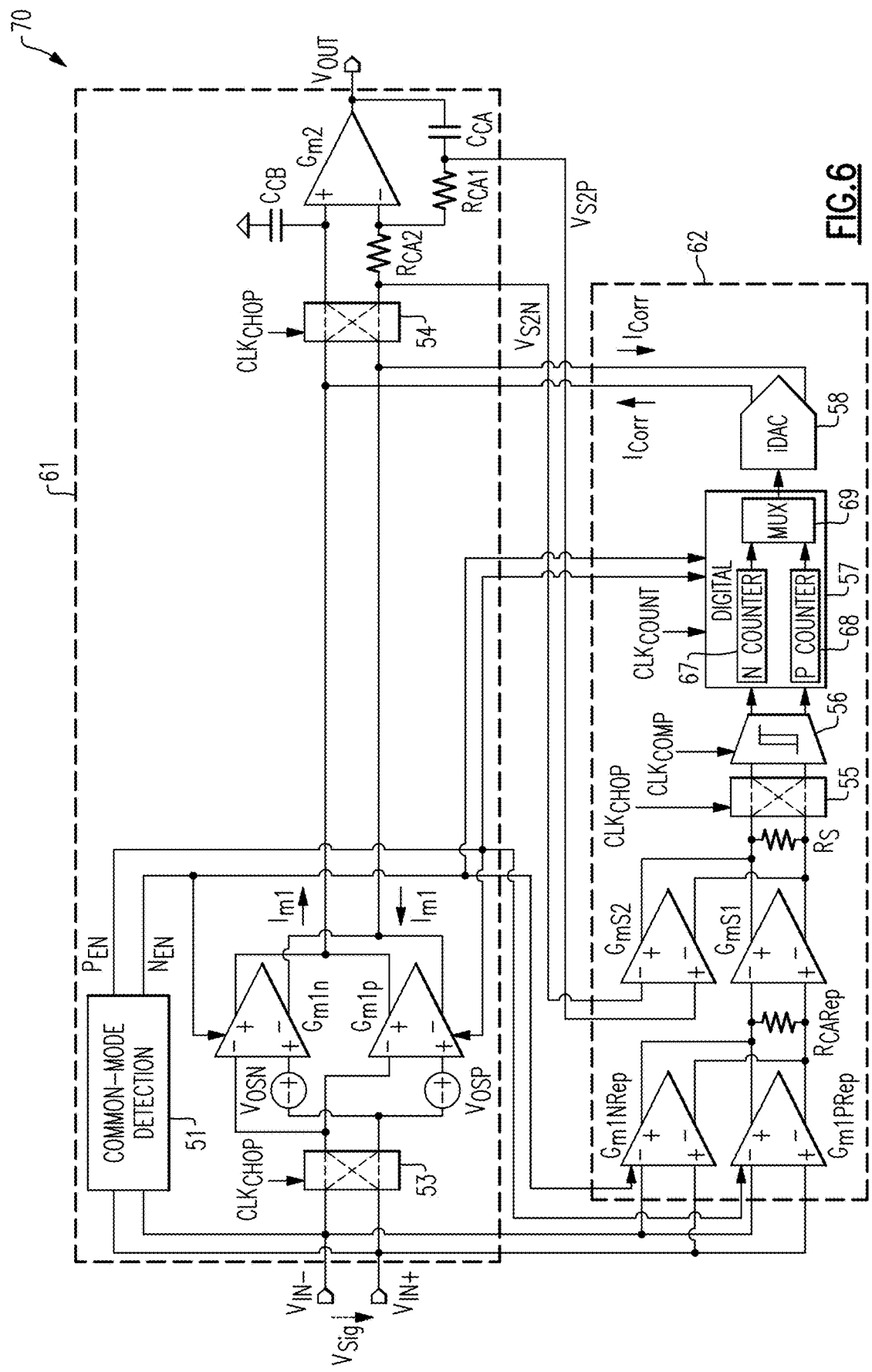
FIG. 6 is a schematic diagram of a chopper amplifier according to another embodiment.

FIG. 6 is a schematic diagram of a chopper amplifier 70 according to another embodiment. The chopper amplifier 70 includes chopper amplifier circuitry 61 and an offset correction circuit 62. The chopper amplifier 70 further includes a pair of differential input terminals $V_{IN+}$, $V_{IN-}$ for receiving a differential input voltage $V_{Sig}$, and a single-ended output terminal $V_{OUT}$ for outputting a single-ended output voltage.

In the illustrated embodiment, the chopper amplifier circuitry 61 includes a common-mode detection circuit 51, an input chopping circuit 53 (controlled by a chopping clock signal $CLK_{CHOP}$), a p-type transconductance amplifier $G_{m1p}$ (including a p-type input pair having an input offset voltage represented by a voltage source $V_{OSP}$), an n-type transconductance amplifier $G_{m1n}$ (including an n-type input pair having an input offset voltage represented by a voltage source $V_{OSN}$), an output chopping circuit 54 (controlled by the chopping clock signal $CLK_{CHOP}$), a second transconductance amplifier $G_{m2}$, a first resistor $R_{CA1}$, a second resistor $R_{CA2}$, a first capacitor $C_{CA}$, and a second capacitor $C_{CB}$.

With continuing reference to FIG. 6, the common-mode detection circuit 51 senses a common-mode input voltage of the pair of differential input terminals $V_{IN+}$, $V_{IN-}$, and enables one of the p-type transconductance amplifier $G_{m1p}$ or the n-type transconductance amplifier $G_{m1n}$ based on the sensed common-mode input voltage. The selected transconductance amplifier is enabled using a first enable signal $N_{EN}$ or a second enable signal $P_{EN}$. The selected transconductance amplifier outputs a differential signal current $I_{m1}$.

Although one embodiment of chopper amplifier circuitry 61 is depicted, the teachings herein are applicable to chopper amplifier circuitry implemented in a wide variety of ways. Accordingly, other implementations are possible.

With continuing reference to FIG. 6, the offset correction circuit 62 incudes a replica transconductance amplifier $G_{m1NRep}$, which corresponds to a replica of the n-type transconductance amplifier $G_{m1n}$, with or without scaling. The offset correction circuit 62 incudes a replica transconductance amplifier $G_{m1PRep}$, which corresponds to a replica of the p-type transconductance amplifier $G_{m1p}$, with or without scaling. The offset correction circuit 62 further includes a first resistor $R_{CARep}$, which corresponds to a replica of the series combination of the first resistor $R_{CA1}$ and the second resistor $R_{CA2}$, with or without scaling.

The offset correction circuit 62 further includes a first sense transconductance amplifier $G_{mS1}$, a second sense transconductance amplifier $G_{mS2}$, a second resistor $R_S$, a chopper circuit 55, a comparator 56, a digital circuit 57 (including a first counter 67 for $G_{m1n}$, a second counter 68 for $G_{m1p}$, and a multiplexer 69), and a current DAC (iDAC) 58. The comparator 56 serves as a 1-bit ADC that generates an up signal and a down signal for controlling a state of the active counter of the digital circuit 57. The digital circuit 57 outputs digital correction data selected by the multiplexer 69 from the first counter 67 or the second counter 68. The digital correction data is used by the current DAC 58 to generate the differential correction current $I_{Corr}$.

In the illustrated embodiment, the chopping circuit 55 is clocked by the chopping clock signal $CLK_{CHOP}$, while the comparator 56 is clocked by the comparator clock signal $CLK_{COMP}$, and the digital circuit 57 is clocked by the counter clock signal $CLK_{COUNT}$. In certain implementations, the comparator clock signal $CLK_{COMP}$ and/or the counter clock signal $CLK_{COUNT}$ are generated by delaying the chopping clock signal $CLK_{CHOP}$ or a divided version thereof. In the example of FIG. 6, the current DAC 58 responds to a change in the digital correction data rather than being driven by a clock signal. Although one example of clocking is depicted, an offset correction circuit can be clocked in a wide variety of ways.

With continuing reference to FIG. 6, the first enable signal $N_{EN}$ and the second enable signal $P_{EN}$ are provided to the offset correction circuit 62 to aid in tracking the input offset of the selected pair of input transistors. For example, the first enable signal $N_{EN}$ is used to selectively enable $G_{m1NRep}$ and the first counter 67, while the second enable signal $P_{EN}$ is used to selectively enable $G_{m1PRep}$ and the second counter 68. Additionally, the multiplexer 69 uses the first enable signal $N_{EN}$ and the second enable signal $P_{EN}$ to select which counter output to provide as the digital correction data for the current DAC 58.

As shown in FIG. 6, the offset correction circuit 62 senses the signal path of the chopper amplifier circuitry 61 at both a differential input to the input chopping circuit 53 and across the series combination of the first resistor $R_{CA1}$ and the second resistor $R_{CA2}$ (corresponding to a voltage difference between $V_{S2P}$ and $V_{S2N}$). Additionally, the offset correction circuit 62 injects the differential correction current $I_{Corr}$ into the chopper amplifier circuitry 61 such that the differential correction current $I_{Corr}$ is combined with the differential signal current $I_{m1}$.

Using multiple sensing points provides a number of advantages, including, providing low input offset voltage when chopping and excellent gain versus frequency characteristics (including at a frequency used for chopping). However, the teachings herein are also applicable to implementations using a single sensing point.

Thus, although one embodiment of the offset correction circuit 62 is depicted, the teachings herein are applicable to offset correction circuits implemented in a wide variety of ways. Accordingly, other implementations are possible.

Figure 7:
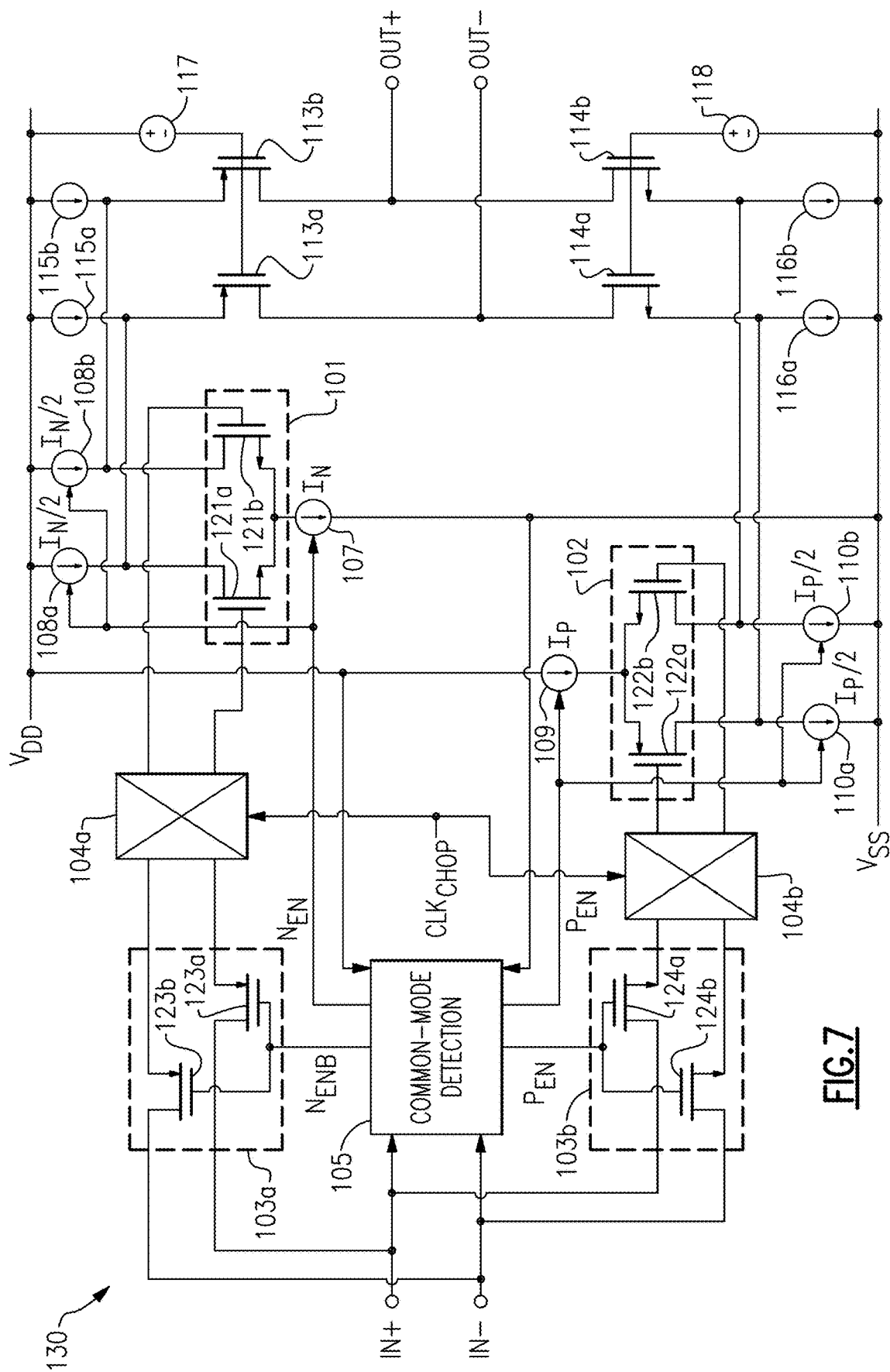
FIG. 7 is a schematic diagram of one embodiment of an amplification circuit for a chopper amplifier.

FIG. 7 is a schematic diagram of one embodiment of an amplification circuit 130 for a chopper amplifier.

The amplification circuit 130 includes a pair of NMOS input transistors 101, a pair of PMOS input transistors 102, a pair of PMOS isolation switches 103a, a pair of NMOS isolation switches 103b, first input chopping switches 104a, second input chopping switches 104b, a common-mode detection circuit 105, a first group of current sources 107, 108a, and 108b, a second group of current sources 109, 110a, and 110b, a first cascode PMOS transistor 113a, a second cascode PMOS transistors 113b, a first cascode NMOS transistor 114a, a second cascode NMOS transistor 114b, a third group of current sources 115a and 115b, a fourth group of current sources 116a and 116b, a first voltage source 117, and a second voltage source 118. The amplification circuit 130 further includes a pair of input terminals (IN+, IN−) and a pair of output terminals (OUT+, OUT−), and is powered by a power high supply voltage $V_{DD}$ and a power low supply voltage $V_{SS}$.

In the illustrated embodiment, the pair of NMOS input transistors 101 is implemented as a differential transistor pair including a first NMOS input transistor 121a and a second NMOS input transistor 121b, which each include a source connected to one another and biased with a common bias current IN from the current source 107. Additionally, the drain of the first NMOS input transistor 121a is biased by a bias current $I_N/2$ from the current source 108a and the drain of the second NMOS input transistor 121b is biased by a bias current $I_N/2$ from the current source 108b.

The pair of PMOS isolation switches 103a include a first PMOS isolation switch 123a and a second PMOS isolation switch 123b. The drains of the PMOS isolation switches 123a-123b are connected to IN+ and IN−, respectively, while the sources of the PMOS isolation switches 123a-123b are connected to the gates of the NMOS input transistors 121a-121b, respectively, through the first input chopping switches 104a. The gates of the PMOS isolation switches 123a-123b are controlled by a first inverted enable signal $N_{ENB}$ from the common-mode detection circuit 105.

With continuing reference to FIG. 7, the pair of PMOS input transistors 102 are implemented as a differential transistor pair including a first PMOS input transistor 122a and a second PMOS input transistor 122b, which each include a source connected to one another and biased with a common bias current $I_P$ from the current source 109. Additionally, the drain of the first PMOS input transistor 122a is biased by a bias current $I_P/2$ from the current source 110a and the drain of the second PMOS input transistor 122b is biased by a bias current $I_P/2$ from the current source 110b.

The pair of NMOS isolation switches 103b include a first NMOS isolation switch 124a and a second NMOS isolation switch 124b. The drains of the NMOS isolation switches 124a-124b are connected to IN+ and IN−, respectively, while the sources of the NMOS isolation switches 124a-124b are connected to the gates of the PMOS input transistors 122a-122b, respectively, through the second input chopping switches 104b. The gates of the NMOS isolation switches 124a-124b are controlled by a second enable signal $P_{EN}$ from the common-mode detection circuit 105.

In the illustrated embodiment, the common-mode detection circuit 105 is coupled to the pair of input terminals (IN+, IN−) to sense an input common-mode voltage. Based on the sensed input common-mode voltage, the common-mode detection circuit 105 selects the pair of NMOS input transistors 101 using a first enable signal $N_{EN}$ or the pair of PMOS input transistors 102 using the second enable signal $P_{EN}$. The selected pair of input transistors amplifies the differential input signal received between IN+ and IN− after chopping by the first input chopping switches 104a or the second input chopping switches 104b.

As shown in FIG. 7, the first input chopping switches 104a and the second input chopping switches 104b are each controlled by a chopping clock signal $CLK_{CHOP}$. In the illustrated embodiment, separate sets of input chopping switches are used for the n-type input pair 101 and the p-type input pair 102. In other embodiments, a shared set of chopping switches are used. Any of the embodiments herein can use shared or separate input chopping switches. Likewise, any of the embodiments herein can use shared or separate output chopping switches.

When the pair of NMOS input transistors 101 are being used, the common-mode detection circuit 105 turns on the pair of PMOS isolation transistors 103a and turns on the first group of current sources 107, 108a, and 108b. However, when the pair of NMOS input transistors 101 are not being used, the common-mode detection circuit 105 turns off the pair of PMOS isolation transistors 103a and turns off the first group of current sources 107, 108a, and 108b.

With continuing reference to FIG. 7, when the pair of PMOS input transistors 102 are being used, the common-mode detection circuit 105 turns on the pair of NMOS isolation transistors 103b and turns on the second group of current sources 109, 110a, and 110b. However, when the pair of PMOS transistors 102 are not being used, the common-mode detection circuit 105 turns off the pair of NMOS isolation transistors 103b and turns off the second group of current sources 109, 110a, and 110b.

Including the PMOS isolation transistors 103a and the NMOS isolation transistors 103b aids in reducing input capacitance. However, the teachings herein are also application to implementations without isolation transistors.

An example of folded cascode circuitry is depicted as being coupled to the pair of NMOS input transistors 101 and the pair of PMOS input transistors 102. The folded cascode circuitry illustrates one example of circuitry suitable for providing the output signal from the pair of NMOS input transistors 101 and the output signal from the pair of PMOS input transistors 102 to a common pair of output terminals (OUT+, OUT−). However, other implementations of circuitry are possible.

Figure 8:
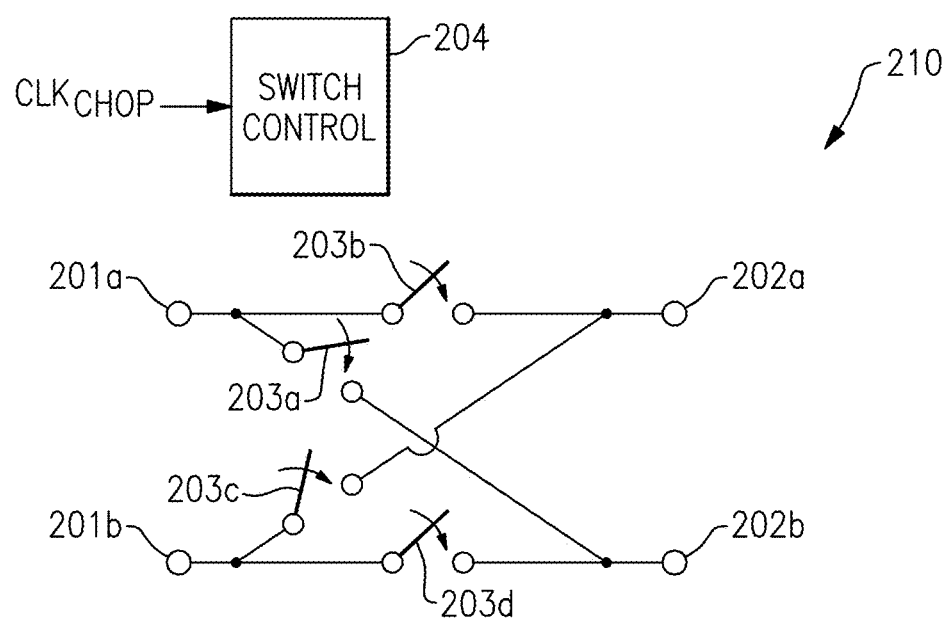
FIG. 8 is a schematic diagram of one example of chopping switches that can be used in a chopper amplifier.

FIG. 8 is a schematic diagram of one example of chopping switches 210 that can be used in a chopper amplifier. However, chopping switches can be implemented in other ways.

As shown in FIG. 8, the chopping switches 210 includes first and second inputs 201a, 201b that operate as a differential input, first and second outputs 202a, 202b that operate as a differential output, first to fourth switches 203a-203d, and a switch control circuit 204. As shown in FIG. 8, the switch control circuit 204 receives a chopping clock signal $CLK_{CHOP}$, which can be used to control a state of the switches 203a-203d over time. Although illustrated as including the switch control circuit 204, in certain configurations the switch control circuit 204 is omitted in favor of providing multiple clock signals (for example, inverted and non-inverted versions of a chopping clock signal, with or without non-overlap) to the chopping switches 210.

The first input 201a is electrically connected to a first end of the first switch 203a and to a first end of the second switch 203b. The second input 201b is electrically connected to a first end of the third switch 203c and to a first end of the fourth switch 203d. The first output 202a is electrically connected to a second end of the second switch 203b and to a second end of the third switch 203c. The second output 202b is electrically connected to a second end of the first switch 203a and to a second end of the fourth switch 203d.

The chopping switches 210 can be used to chop a differential input signal received between the first and second inputs 201a, 201b to generate a differential chopped signal between the first and second outputs 202a, 202b. For example, during a first clock phase of the chopping clock signal $CLK_{CHOP}$, the switch control circuit 204 can close the second and fourth switches 203b, 203d and open the first and third switches 203a, 203c. Additionally, during a second clock phase of the chopping clock signal $CLK_{CHOP}$, the switch control circuit 204 can close the first and third switches 203a, 203c and open the second and fourth switches 203b, 203d.

The clock signals disclosed herein can be implemented in a wide variety of ways, including, for example, by using any suitable clock generator. In certain implementations, a common clock signal is used to synthesize clock signals used for chopping, auto-zeroing, digital processing, and/or other operations of a chopper amplifier.

Applications

Devices employing the above described schemes can be implemented into various electronic devices. Examples of electronic devices include, but are not limited to, consumer electronic products, electronic test equipment, communication systems, data converters, etc.

CONCLUSION

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A chopper amplifier with tracking of multiple input offsets, the chopper amplifier comprising:
chopper amplifier circuitry comprising:
an input chopping circuit configured to chop an input signal to generate a chopped input signal;
an amplification circuit configured to amplify the chopped input signal to generate an amplified signal, wherein the amplification circuit comprises two or more pairs of input transistors that are selectable;
an output chopping circuit configured to chop the amplified signal to generate a chopped output signal; and
a control circuit configured to choose a selected pair of input transistors from the two or more pairs of input transistors, wherein the selected pair of input transistors is configured to amplify the chopped input signal; and
an offset correction circuit configured to generate an input offset compensation signal for the chopper amplifier circuitry, wherein the offset correction circuit separately tracks an input offset of each of the two or more pairs of input transistors.

2. The chopper amplifier of claim 1, wherein the offset correction circuit comprises a digital circuit configure to generate digital correction data indicating a value of the input offset compensation signal for each of the two or more pairs of input transistors.

3. The chopper amplifier of claim 2, wherein the digital circuit comprises a non volatile memory configured to store the digital correction data.

4. The chopper amplifier of claim 2, wherein the digital circuit comprises a memory configured to store the digital correction data, wherein the digital circuit is coupled to digital interface operable to read or write the memory.

5. The chopper amplifier of claim 2, wherein the offset correction circuit comprises analog sense circuitry configured to generate a sense signal based on sensing a signal path through the chopper amplifier circuitry, an analog-to-digital converter configured to convert the sense signal into a digital input signal for the digital circuit, and a digital-to-analog converter configured to control the input offset compensation signal based on the digital correction data.

6. The chopper amplifier of claim 5, wherein the analog-to-digital converter comprises a comparator, and the digital circuit comprises two or more counters each configured to track the input offset of a corresponding one of the two or more pairs of input transistors.

7. The chopper amplifier of claim 5, wherein the analog sense circuitry comprises a chopping circuit configured to output the sense signal, and a sense amplifier having an input coupled to the signal path and an output coupled to an input of the chopping circuit.

8. The chopper amplifier of claim 1, wherein the two or more pairs of input transistors includes a pair of n-type input transistors and a pair of p-type input transistors.

9. The chopper amplifier of claim 8, further comprising a first pair of isolation switches coupled to the pair of n-type input transistors and a second pair of isolation switches coupled to the pair of p-type input transistors, wherein the control circuit closes the first pair of isolation switches and opens the second pair of isolation switches when the selected pair of input transistors corresponds to the pair of n-type input transistors, and closes the second pair of isolation switches and opens the first pair of isolation switches when the selected pair of input transistors corresponds to the pair of p-type input transistors.

10. The chopper amplifier of claim 1, further comprising a pair of input terminals configured to receive the input signal, wherein the control circuit chooses the selected pair of input transistors based on sensing an input common-mode voltage of the pair of input terminals.

11. The chopper amplifier of claim 1, wherein the offset correction circuit is configured to generate the input offset compensation signal based on sensing a signal path through the chopper amplifier circuitry at two or more signal points.

12. The chopper amplifier of claim 11, wherein the two or more signal points includes a first signal point before the input chopping circuit and a second signal point after the output chopping circuit.

13. The chopper amplifier of claim 11, wherein the offset correction circuit is configured to provide the input offset compensation signal to an output of the amplification circuit.

14. The chopper amplifier of claim 1, wherein the control circuit generates two or more enable signals each operable to select a corresponding one of the two or more pairs of input transistors, wherein the control circuit provides the two or more enable signals to the offset correction circuit.

15. A method of amplification, the method comprising:
chopping an input signal to generate a chopped input signal using an input chopping circuit;
selecting a pair of input transistors from two or more pairs of input transistors of an amplification circuit using a control circuit;
amplifying the chopped input signal to generate an amplified signal using the selected pair of input transistors;
chopping the amplified signal to generate a chopped output signal using an output chopping circuit; and
compensating the amplification circuit using an input offset compensation signal generated by an offset correction circuit, including separately tracking an input offset of each of the two or more pairs of input transistors.

16. The method of claim 15, wherein compensating the amplification circuit for the input offset comprises generating digital correction data indicating a value of the input offset compensation signal for each of the two or more pairs of input transistors.

17. The method of claim 16, further comprising storing the digital correction data in a non-volatile memory, performing a power cycle, and compensating the amplification circuit for the input offset after the power cycle using the stored digital correction data.

18. The method of claim 15, wherein the two or more pairs of input transistors comprises a pair of n-type input transistors and a pair of p-type input transistors, the method further comprising choosing the selected pair of input transistors based on an input common-mode voltage.

19. A chopper amplifier comprising:
a pair of input terminals;
chopper amplifier circuitry comprising:
an input chopping circuit including an input coupled to the pair of input terminals;
an amplification circuit including an input coupled to an output of the input chopping circuit, wherein the amplification circuit comprises two or more pairs of input transistors that are selectable;
an output chopping circuit including an input coupled to an output of the amplification circuit; and
a control circuit configured to choose a selected pair of input transistors from the two or more pairs of input transistors to provide amplification; and
an offset correction circuit configured to separately track an input offset of each of the two or more pairs of input transistors, and to generate an input offset compensation signal for compensating the amplification circuit.

20. The chopper amplifier of claim 19, wherein the offset correction circuit comprises a digital circuit configure to generate digital correction data indicating a value of the input offset compensation signal for each of the two or more pairs of input transistors.

* * * * *